(12) United States Patent
Bae et al.

(10) Patent No.: US 11,244,986 B2
(45) Date of Patent: Feb. 8, 2022

(54) DISPLAY DEVICE

(71) Applicant: Samsung Display Co., Ltd., Yongin-Si (KR)

(72) Inventors: Kwang Soo Bae, Yongin-si (KR); Beomsoo Park, Hwaseong-si (KR); Minjeong Oh, Gimpo-si (KR); Eunhee Han, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/808,879

(22) Filed: Mar. 4, 2020

(65) Prior Publication Data

US 2020/0395416 A1    Dec. 17, 2020

(30) Foreign Application Priority Data

Jun. 17, 2019    (KR) ........................ 10-2019-0071547

(51) Int. Cl.
```
G02B 5/22      (2006.01)
H01L 27/32     (2006.01)
H01L 51/52     (2006.01)
H01L 51/00     (2006.01)
```

(52) U.S. Cl.
CPC ............ *H01L 27/322* (2013.01); *G02B 5/223* (2013.01); *H01L 51/0076* (2013.01); *H01L 51/5268* (2013.01); *H01L 51/5284* (2013.01); *H01L 27/3246* (2013.01)

(58) Field of Classification Search
CPC ........... H01L 51/502; H01L 31/035218; H01L 51/0076; G02F 2001/01791; G02F 2001/133614; G02F 1/13718; G02F 1/133514; G02F 1/01791; G02F 1/133614; G09G 2300/0486; G09G 2300/0495
See application file for complete search history.

(56) References Cited

U.S. PATENT DOCUMENTS

| | | | |
|---|---|---|---|
| 2006/0045991 A1* | 3/2006 | Kokeguchi | ............ C09K 19/60 428/1.1 |
| 2011/0216271 A1* | 9/2011 | Suzuki | ................ G02F 1/13362 349/71 |
| 2016/0306226 A1* | 10/2016 | Yoon | ................. G02F 1/133377 |
| 2018/0337354 A1 | 11/2018 | Sonoda et al. | |

(Continued)

FOREIGN PATENT DOCUMENTS

| KR | 1020150125197 A | 11/2015 |
|---|---|---|
| KR | 1020170120461 A | 10/2017 |
| KR | 101920226 B1 | 11/2018 |

*Primary Examiner* — Michael H Caley
*Assistant Examiner* — Mariam Qureshi
(74) *Attorney, Agent, or Firm* — Cantor Colburn LLP

(57) ABSTRACT

A display device includes a plurality of light emitting elements which emits a blue light; a light control layer disposed on the light emitting elements and including: a first light control part which absorb the blue light and emits a red light; a second light control part which absorbs the blue light and emits a green light; and a third light control part which transmits the blue light; and a light selective filter disposed on the light control layer. The light selective filter includes a liquid crystal filter and a color filter. The liquid crystal filter transmits red light and green light and blocks blue light. The color filter is absorbs the red light and the green light and transmits the blue light.

12 Claims, 13 Drawing Sheets

(56) References Cited

U.S. PATENT DOCUMENTS

2019/0011620 A1    1/2019  Kuroda et al.
2020/0133053 A1*   4/2020  Yang ................. G02F 1/133514
2020/0264461 A1*   8/2020  Kuwana ............... G02B 6/0091

* cited by examiner

DISPLAY DEVICE

This application claims priority to Korean Patent Application No. 10-2019-0071547, filed on Jun. 17, 2019, and all the benefits accruing therefrom under 35 U.S.C. § 119, the content of which in its entirety is herein incorporated by reference.

BACKGROUND

1. Field

The disclosure herein relates to a display device, and more particularly, to a display device with improved light output efficiency and visibility.

2. Description of the Related Art

Various display devices used in multimedia devices such as televisions, portable phones, tablet computers, navigation systems, and game consoles have been developed. Input devices of such display devices may include keyboards and/or mouses. Techniques for improving light output efficiency and visibility of display devices are being actively researched.

SUMMARY

The disclosure may provide a display device capable of improving light output efficiency.

The disclosure may also provide a display device capable of improving visibility by reducing reflection of external light.

In an embodiment of the invention, a display device includes a plurality of light emitting elements, a light control layer, and a light selective filter. In such an embodiment, the light emitting elements emit a blue light, the light control layer is disposed on the light emitting elements and includes a first light control part, a second light control part, and a third light control part, and the light selective filter is disposed on the light control layer. In such an embodiment, the first light control part absorbs the blue light and emits a red light, the second light control part absorbs the blue light and emits a green light, and the third light control part transmits the blue light. In such an embodiment, the light selective filter includes a liquid crystal filter and a color filter. In such an embodiment, the liquid crystal filter overlaps the first light control part and the second light control part, and the liquid crystal filter transmits the red light and the green light and blocks the blue light. In such an embodiment, the color filter overlaps the third light control part, and the color filter absorbs the red light and the green light and transmits the blue light.

In an embodiment, the red light may have a central wavelength in a range of about 600 nanometers (nm) to about 670 nm, the green light may have a central wavelength of in a range about 500 nm to about 580 nm, and the blue light may have a central wavelength in a range of about 420 nm to about 480 nm.

In an embodiment, the liquid crystal filter may include a plurality of first liquid crystal groups and a plurality of second liquid crystal groups. In such an embodiment, each of the first liquid crystal groups may include a plurality of first liquid crystal molecules, and the first liquid crystal molecules may be sequentially arranged in a first direction at a first distance. In such an embodiment, each of the second liquid crystal groups may include a plurality of second liquid crystal molecules, and the second liquid crystal molecules may be sequentially arranged in the first direction at a second distance different from the first distance.

In an embodiment, the first distance may be less than the second distance.

In an embodiment, the first liquid crystal molecules and the second liquid crystal molecules may be a lyotropic liquid crystal.

In an embodiment, the first liquid crystal molecules and the second liquid crystal molecules may include a dichlorobenzene derivative.

In an embodiment, the first liquid crystal groups may block light in a wavelength range less than about 500 nm and transmit light in a wavelength range from about 500 nm to about 650 nm. In such an embodiment, the second liquid crystal groups may block light in a wavelength range less than about 550 nm and transmit light in a wavelength range from about 550 nm to about 650 nm.

In an embodiment, a weight ratio of the first liquid crystal groups to the second liquid crystal groups in the liquid crystal filter may be in a range from about 6:4 to about 8:2.

In an embodiment, each of the first liquid crystal molecules and the second liquid crystal molecules may have a long axis and a short axis. In such an embodiment, the short axis of each of the first liquid crystal molecules and the short axis of each of the second liquid crystal molecules may be aligned in a same direction as each other.

In an embodiment, the light selective filter may further include an auxiliary liquid crystal filter disposed on the liquid crystal filter, where the auxiliary liquid crystal filter may include a plurality of first auxiliary liquid crystal groups and a plurality of second auxiliary liquid crystal groups. In such an embodiment, the first auxiliary liquid crystal groups may include a plurality of first auxiliary liquid crystal molecules, and each of the first auxiliary liquid crystal molecules may have a short axis and a long axis. In such an embodiment, the short axis of each of the first auxiliary liquid crystal molecules may be aligned in a direction perpendicular to an aligned direction of the short axis of each of the first liquid crystal molecules when viewed in a plan view. In such an embodiment, the second auxiliary liquid crystal groups may include a plurality of second auxiliary liquid crystal molecules, and each of the second auxiliary liquid crystal molecules may have a short axis and a long axis. In such an embodiment, the short axis of each of the second auxiliary liquid crystal molecules may be aligned in a direction perpendicular to an aligned direction of the short axis of each of the second liquid crystal molecules when viewed in the plan view.

In an embodiment, the first light control part may include a plurality of first quantum dots which absorbs the blue light and emits the red light. In such an embodiment, the second light control part may include a plurality of second quantum dots which absorbs the blue light and emits the green light.

In an embodiment, the color filter may include at least one selected from a blue pigment and a blue dye.

In an embodiment, the display device may further include a light blocking layer disposed between the first and second light control parts and between the second and third light control parts.

In an embodiment, each of the light emitting elements may include at least one selected from an organic electroluminescent element and a quantum-dot electroluminescent element.

In an embodiment of the invention, a display device includes a light emitting element layer including a plurality of light emitting elements which emit a blue light, a light control layer disposed on the light emitting element layer, a liquid crystal filter which is disposed on the light control layer and overlaps the first light control part and the second light control part, and a color filter which is disposed on the light control layer, and overlaps with the third light control part. In such an embodiment, the light control layer includes: a first light control part including a plurality of first quantum dots which absorbs the blue light and emits red light; a second light control part including a plurality of second quantum dots which absorbs the blue light and emits green light; and a third light control part which transmits the blue light. In such an embodiment, the liquid crystal filter includes a plurality of lyotropic liquid crystal molecules which transmits the red light and the green light and to block the blue light. In such an embodiment, the color filter absorbs the red light and the green light and transmits the blue light.

In an embodiment, the display device may further include a window disposed on the light control layer and having a top surface and a bottom surface opposite to each other in a thickness direction. In such an embodiment, the liquid crystal filter may be disposed on the top surface or the bottom surface of the window.

In an embodiment, the liquid crystal filter may include a plurality of first liquid crystal groups a plurality of and second liquid crystal groups. In such an embodiment, each of the first liquid crystal groups may include a plurality of first liquid crystal molecules sequentially arranged in a first direction at a first distance, and each of the second liquid crystal groups may include a plurality of second liquid crystal molecules sequentially arranged in the first direction at a second distance different from the first distance.

In an embodiment, the first distance may be less than the second distance. In such an embodiment, the first liquid crystal groups may block light in a wavelength range less than about 500 nm and transmit light in a wavelength range from about 500 nm to about 650 nm, and the second liquid crystal groups may block light in a wavelength range less than about 550 nm and transmit light in a wavelength range from about 550 nm to about 650 nm.

In an embodiment, a weight ratio of the first liquid crystal groups to the second liquid crystal groups in the liquid crystal filter may be in a range from about 6:4 to about 8:2.

In an embodiment, a thickness of the liquid crystal filter may be less than a thickness of the color filter.

BRIEF DESCRIPTION OF THE DRAWINGS

The accompanying drawings are included to provide a further understanding of embodiments of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
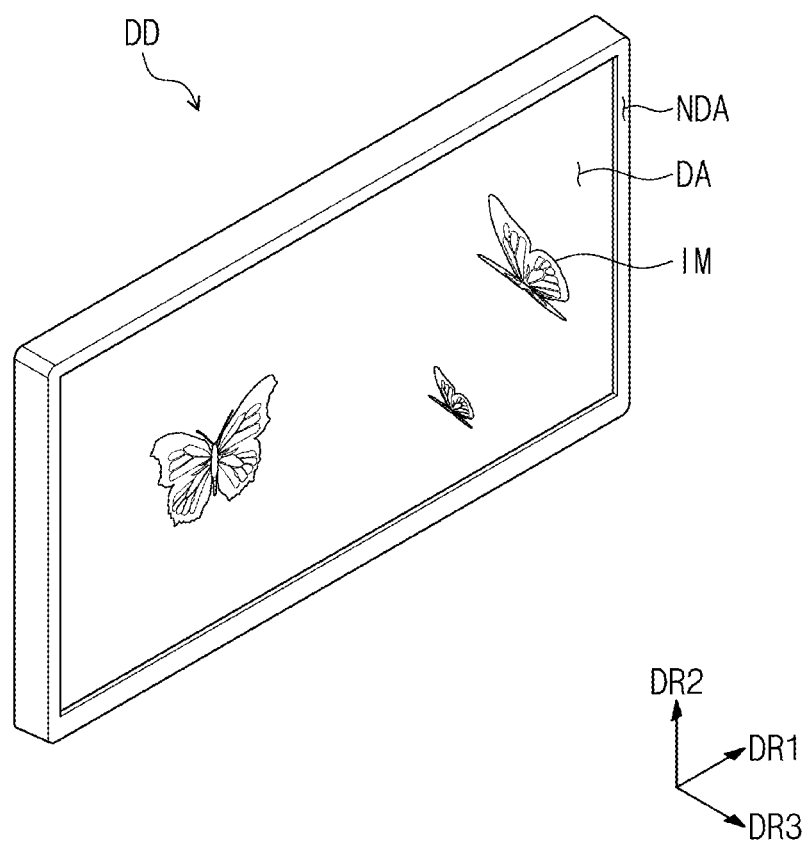
FIG. 1 is a perspective view illustrating a display device according to an embodiment of the invention.

The invention now will be described more fully hereinafter with reference to the accompanying drawings, in which various embodiments are shown. The invention may, however, be embodied in many different forms, and should not be construed as limited to the embodiments set forth herein. Rather, these embodiments are provided so that this disclosure will be thorough and complete, and will fully convey the scopes of the invention to those skilled in the art. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Hereinafter, exemplary embodiments of the invention will be described in detail with reference to the accompanying drawings.

Figure 2:
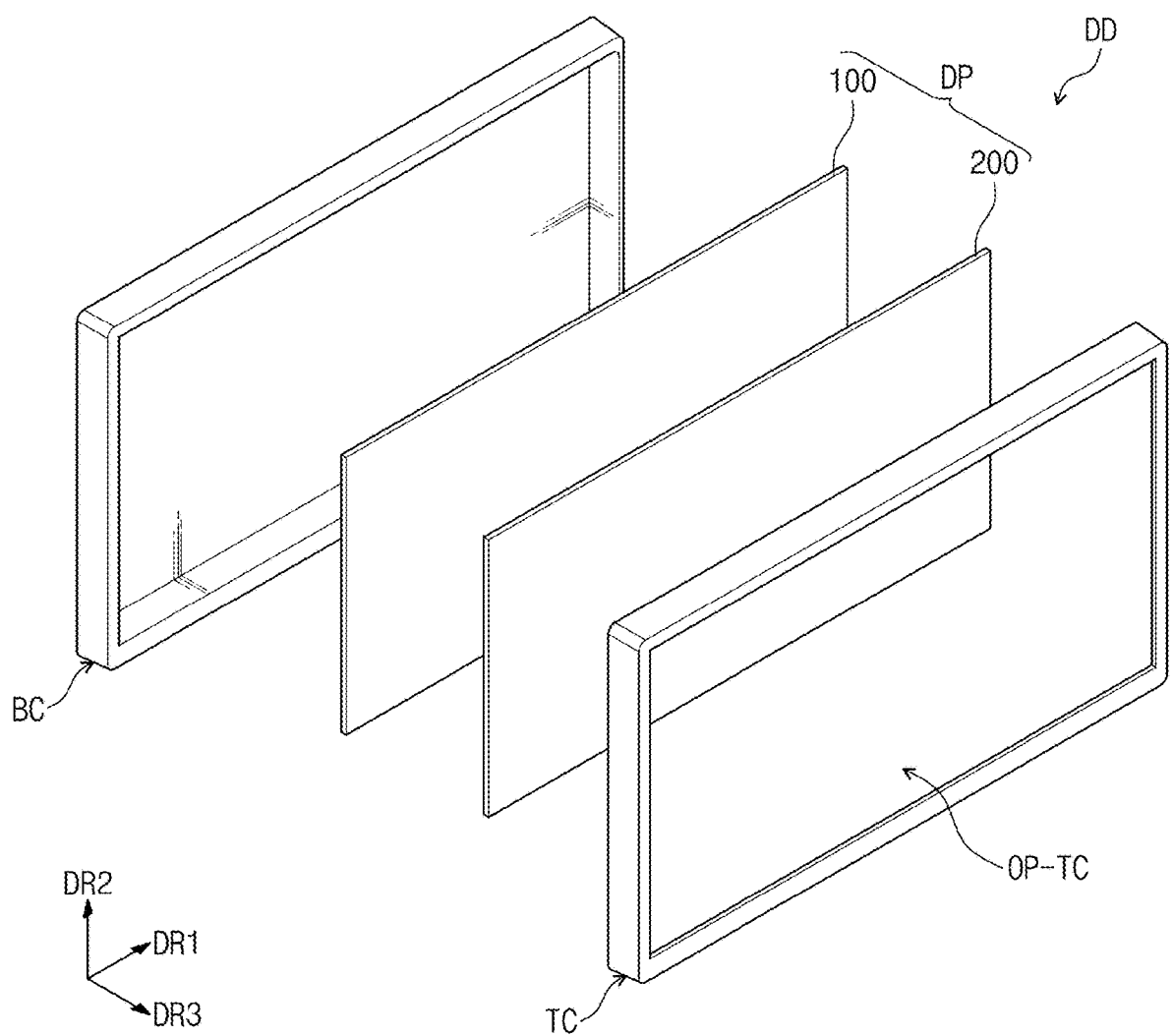
FIG. 2 is an exploded perspective view illustrating a display device according to an embodiment of the invention.

FIG. 1 is a perspective view illustrating a display device DD according to an embodiment of the invention. FIG. 2 is an exploded perspective view illustrating a display device DD according to an embodiment of the invention.

Referring to FIG. 1, in an embodiment, a display area DA and a non-display area NDA may be defined in a display device DD. The display area DA may be an area in which an image IM, e.g., a butter fly, is displayed as shown in FIG. 1. The non-display area NDA may be an area in which the image IM is not displayed. Pixels (not shown) may be disposed in the display area DA but may not be disposed in the non-display area NDA. The pixels (not shown) may mean effective pixels for providing the image IM.

The display area DA may be parallel to a plane defined by a first directional axis DR1 and a second directional axis DR2. A normal direction of the display area DA (i.e., a thickness direction of the display device DD) may be indicated by a third directional axis DR3. A front surface (or a top surface) and a rear surface (or a bottom surface) of each of components or members may be defined by a direction indicated by the third directional axis DR3. However, directions indicated by the first to third directional axes DR1, DR2 and DR3 may be relative concepts and may be changed into other directions. Herein, first to third directions are the directions indicated by the first to third directional axes DR1, DR2 and DR3, respectively, and are indicated by the same reference designators as the first to third directional axes DR1, DR2 and DR3, respectively.

In an embodiment, the display device DD may be a television as shown in FIG. 1. However, embodiments of the invention are not limited thereto. In alternative embodiments, the display device DD may be a large-sized electronic device (e.g., a monitor or an external billboard) or a small and middle-sized electronic device (e.g., a personal computer, a notebook computer, a personal digital assistant ("PDA"), a car navigation unit, a game console, a portable electronic device, or a camera), for example, but not being limited thereto. An embodiment of the display device DD according to the invention may also be applied to other electronic devices without departing the spirits and scopes of the invention.

A bezel area of the display device DD may be defined by the non-display area NDA. The non-display area NDA may be adjacent to the display area DA. The non-display area NDA may surround the display area DA. However, embodiments of the invention are not limited thereto. The shapes of the display area DA and the non-display area NDA may be variously designed or modified. In another alternative embodiment, the non-display area NDA may be omitted.

Referring to FIG. 2, the display device DD may include a bottom cover BC, a display panel DP, and a top cover TC. The bottom cover BC may be disposed under the display panel DP and may protect the display device DD from an external impact and/or a contaminant.

The display panel DP may include a first display substrate 100 and a second display substrate 200. The second display substrate 200 may be disposed on the first display substrate 100. The first display substrate 100 and the second display substrate 200 will be described later in greater detail.

In an alternative embodiment, the top cover TC may be omitted. In such an embodiment of the display device DD where the top cover TC is omitted, the non-display area NDA may be defined by a sealing member or a mold.

The top cover TC may protect the display panel DP from an external impact and/or a contaminant. An opening OP-TC of the top cover TC may expose a front surface of the display panel DP to define the display area DA.

Figure 3:
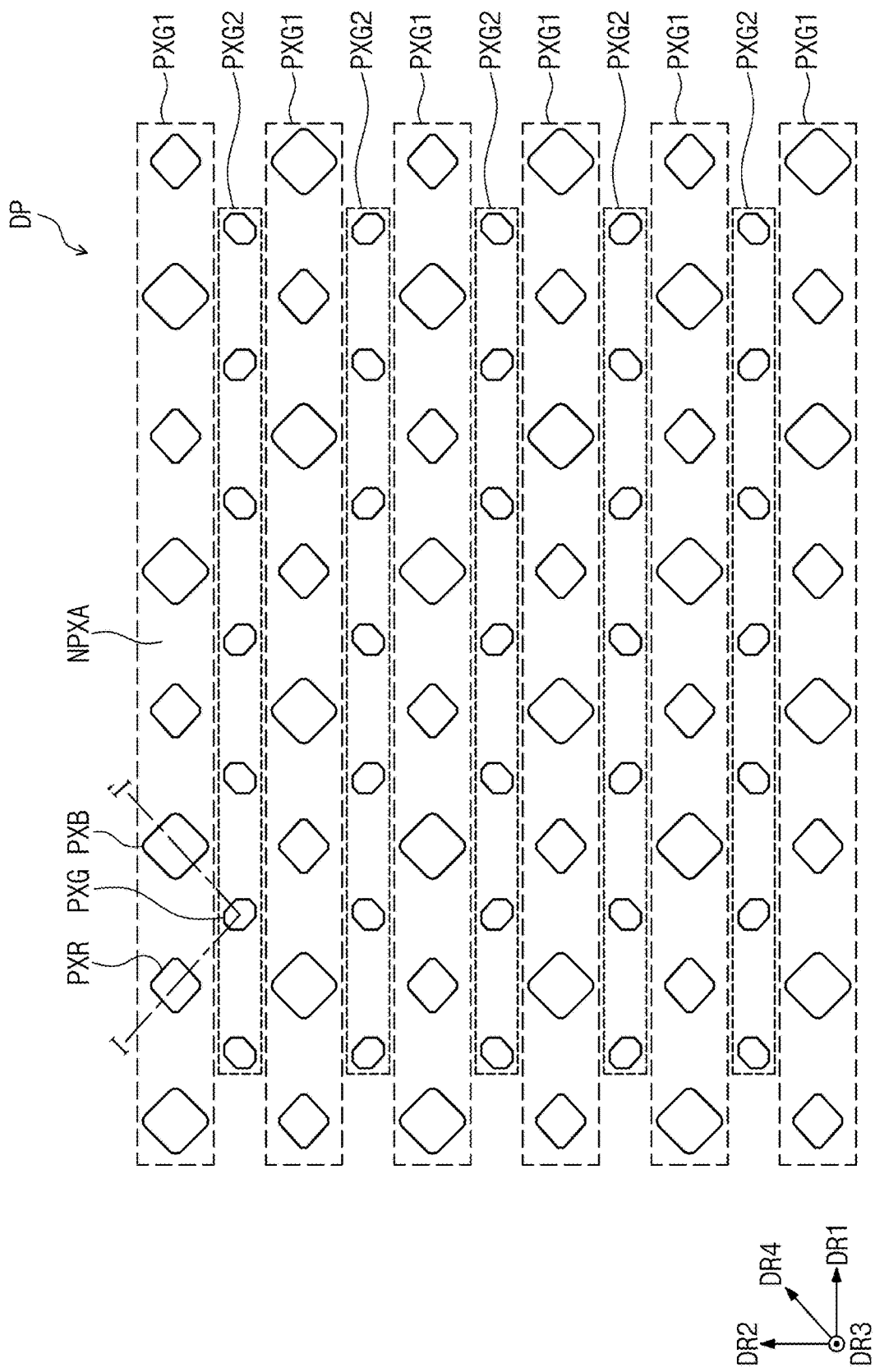
FIG. 3 is a plan view illustrating a display panel according to an embodiment of the invention.
Figure 4:
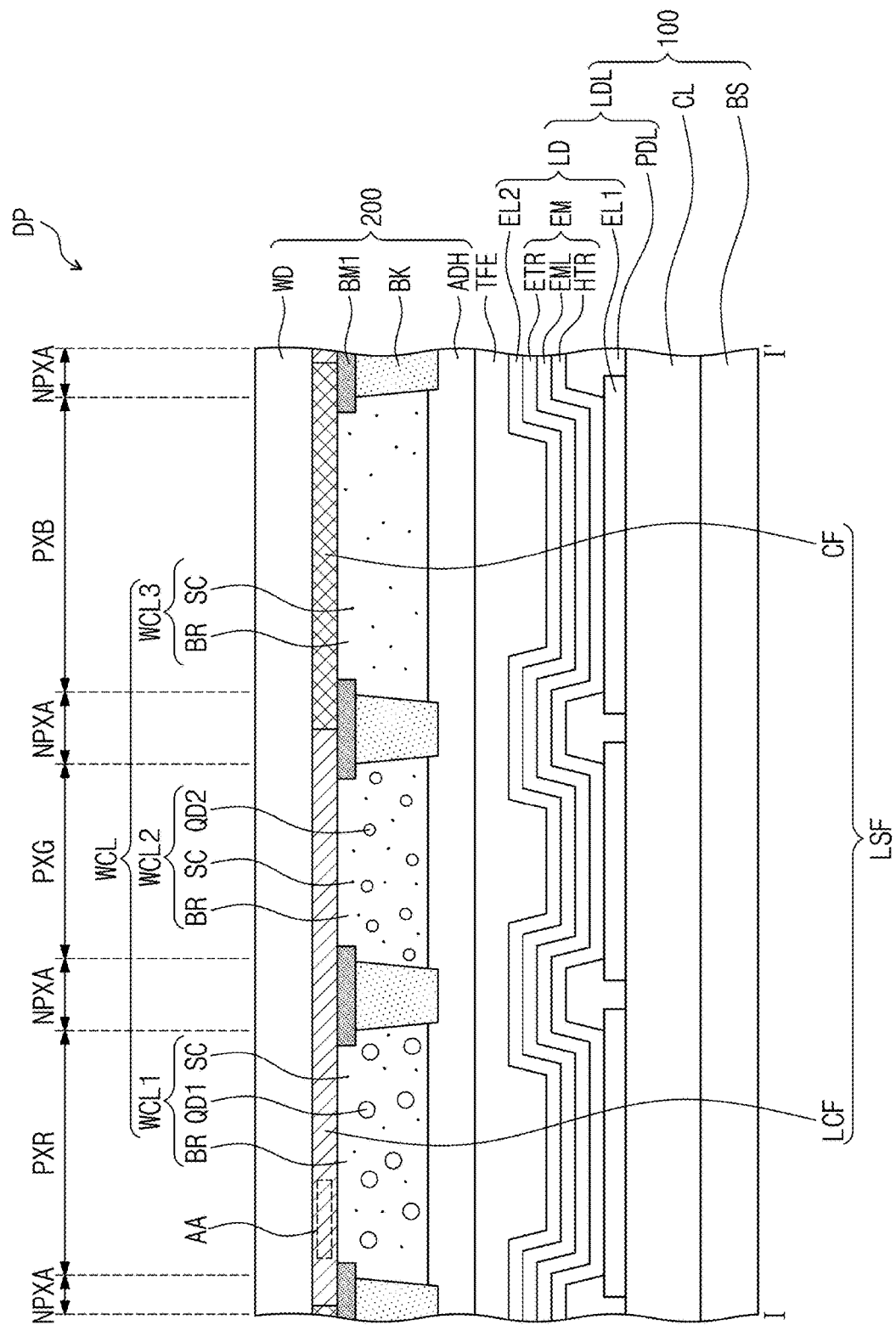
FIG. 4 is a cross-sectional view taken along line I-I' of FIG. 3.
Figure 5:
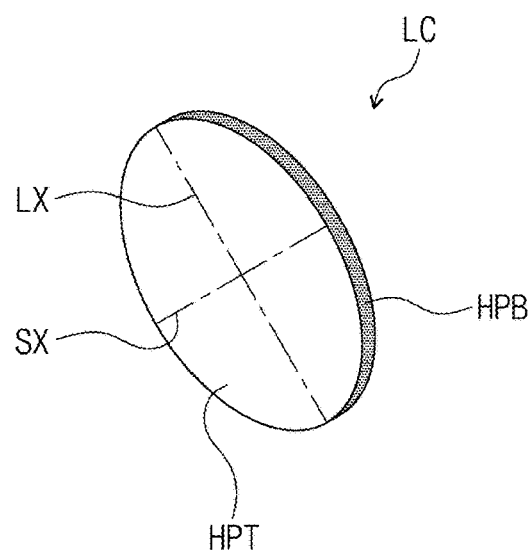
FIG. 5 is a perspective view illustrating a liquid crystal molecule according to an embodiment of the invention.
Figure 6:
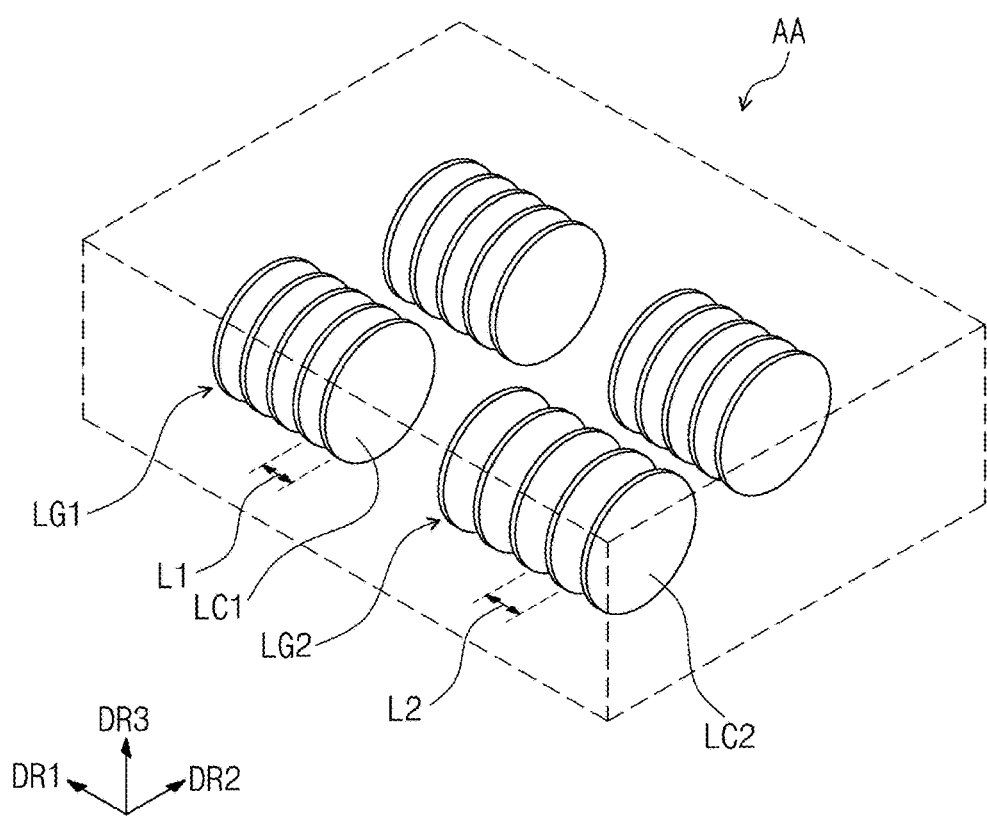
FIG. 6 is an enlarged perspective view corresponding to an area 'AA' of FIG. 4.

FIG. 3 is a plan view illustrating a display panel DP according to an embodiment of the invention. FIG. 4 is a cross-sectional view taken along line I-I' of FIG. 3. FIG. 5 is a perspective view illustrating a liquid crystal molecule according to an embodiment of the invention. FIG. 6 is an enlarged perspective view corresponding to an area 'AA' of FIG. 4.

Referring to FIGS. 3 and 4, an embodiment of the display panel DP may include a non-light emitting area NPXA and light emitting areas PXR, PXG and PXB. Each of the light emitting areas PXR, PXG and PXB may be an area from which light generated in each of light emitting elements LD is emitted. Areas (or sizes) of the light emitting areas PXR, PXG and PXB may be different from each other. Herein, the term 'area (or size)' may mean an area (or size) when viewed in a plan view. Herein, it may be understood that when one or more components are viewed in a plan view, it or they may be viewed in a direction opposite to the third direction DR3 (or the thickness direction). The light emitting areas PXR, PXG and PXB may be divided into a plurality of groups, depending on colors of lights generated in the light emitting elements LD (see FIG. 4).

In an embodiment of the display panel DP, as shown in FIGS. 3 and 4, the light emitting areas may include three light emitting areas PXR, PXG and PXB for emitting first color light, second color light and third color light. In one embodiment, for example, the display panel DP may include a first light emitting area PXR, a second light emitting area PXG, and a third light emitting area PXB.

In an embodiment, the display panel DP may include a plurality of light emitting elements LD configured to emit the third color light, and light control parts WCL1, WCL2 and WCL3. Each of the light control parts WCL1, WCL2 and WCL3 may absorb or transmit the third color light, and the light control parts WCL1, WCL2 and WCL3 may emit lights of different wavelength ranges from each other. In such an embodiment, the light control parts WCL1, WCL2 and WCL3 may emit lights of different colors by absorbing or transmitting the third color light. In one embodiment, for example, a first light control part WCL1 may absorb the third color light and emit the first color light, a second light control part WCL2 may absorb the third color light and emit the second color light, and a third light control part WCL3 may transmit the third color light. In one embodiment, for example, the first color light may be red light, the second color light may be green light, and the third color light may be blue light. In one embodiment, for example, the first color light may be the red light having a central wavelength of about 600 nanometers (nm) to about 670 nm, the second color light may be the green light having a central wavelength of about 500 nm to about 580 nm, and the third color light may be the blue light having a central wavelength of about 420 nm to about 480 nm. However, embodiments of the invention are not limited thereto.

The first, second and third light control parts WCL1, WCL2 and WCL3 may be disposed to correspond to the first light emitting area PXR, the second light emitting area PXG and the third light emitting area PXB, respectively. The first, second and third light control parts WCL1, WCL2 and WCL3 may overlap the first light emitting area PXR, the second light emitting area PXG and the third light emitting area PXB, respectively, when viewed in a plan view. In one embodiment, for example, the first light emitting area PXR may be a red light emitting area, the second light emitting area PXG may be a green light emitting area, and the third light emitting area PXB may be a blue light emitting area.

In an embodiment of the display panel DP, as shown in FIGS. 3 and 4, the light emitting areas PXR, PXG and PXB may have different areas (or sizes) from each other, depending on the colors of the lights emitted from the light control parts WCL1, WCL2 and WCL3 of a light control layer WCL. In one embodiment, for example, as illustrated in FIGS. 3 and 4, the third light emitting area PXB of the third light control part WCL3 that emits the third color light may have the largest area (or size), and the second light emitting area PXG of the second light control part WCL2 emit that emits ting the second color light may have the smallest area (or size). However, embodiments of the invention are not limited thereto. In an alternative embodiment, the light emitting areas PXR, PXG and PXB may have a same area (or size) as each other or may be provided with an area ratio different from the area ratio illustrated in FIGS. 3 and 4.

The light emitting areas PXR, PXG and PXB may be defined by a pixel defining layer PDL. The non-light emitting area NPXA may be defined between the light emitting areas PXR, PXG and PXB adjacent to each other and may correspond to the pixel defining layer PDL. In such an embodiment, each of the light emitting areas PXR, PXG and PXB may correspond to a pixel.

The pixel defining layer PDL may include or be formed of a polymer resin. In one embodiment, for example, the pixel defining layer PDL may include a polyacrylate-based resin or a polyimide-based region. The pixel defining layer PDL may further include an inorganic material in addition to the polymer resin. In an embodiment, the pixel defining layer PDL may include a light absorbing material or may include a black pigment or a black dye. The pixel defining layer PDL including the black pigment or the black dye may be realized as a black pixel defining layer. In such an embodiment, when the pixel defining layer PDL is formed, carbon black may be used as the black pigment or the black dye. However, embodiments of the invention are not limited thereto.

In an alternative embodiment, the pixel defining layer PDL may include or be formed of an inorganic material. In one embodiment, for example, the pixel defining layer PDL may include or be formed of at least one material selected from silicon nitride (SiNx), silicon oxide (SiOx), and silicon oxynitride (SiOxNy). The pixel defining layer PDL may define the light emitting areas PXR, PXG and PXB. The light emitting areas PXR, PXG and PXB and the non-light emitting area NPXA may be defined by the pixel defining layer PDL.

In an embodiment, as shown in FIG. 3, the first light emitting areas PXR and the third light emitting areas PXB may be alternately arranged in the first direction DR1 to constitute a first group PXG1. The second light emitting areas PXG may be arranged in the first direction DR1 to constitute a second group PXG2.

The first group PXG1 may be spaced apart from the second group PXG2 in the second direction DR2. Each of the first group PXG1 and the second group PXG2 may be provided in plurality. The first groups PXG1 and the second groups PXG2 may be alternately arranged in the second direction DR2, e.g., in a zig-zag arrangement.

The second light emitting area PXG may be spaced apart from the first light emitting area PXR or the third light emitting area PXB in a fourth direction DR4. The fourth direction DR4 may be a direction between the first direction DR1 and the second direction DR2.

The arrangement structure of the light emitting areas PXR, PXG and PXB illustrated in FIG. 3 may be referred to as a pentile structure. However, embodiments of the invention are not limited to the arrangement structure of the light emitting areas PXR, PXG and PXB illustrated in FIG. 3. In an alternative embodiment, the light emitting areas PXR, PXG and PXB may be arranged in a stripe structure in which the first light emitting areas PXR, the second light emitting areas PXG and the third light emitting areas PXB are sequentially alternately arranged in the second direction DR2.

Referring to FIG. 4, the first display substrate 100 may include a base film BS, a circuit layer CL, and a light emitting element layer LDL. The second display substrate 200 may include the light control layer WCL and window WD.

The base film BS may provide a base surface on which the circuit layer CL is disposed. In an embodiment, the base film BS may be a silicon substrate, a plastic substrate, a glass substrate or a metal substrate. In an alternative embodiment, the base film BS may have a stack structure including a plurality of insulating layers. However, embodiments of the invention are not limited thereto. In another alternative embodiment, the base film BS may include an inorganic layer, an organic layer, or a composite material layer.

The circuit layer CL may be disposed on the base film BS. The circuit layer CL may include a plurality of transistors (not shown). Each of the transistors (not shown) may include a control electrode, an input electrode, and an output electrode. In one embodiment, for example, the circuit layer CL may include a switching transistor (not shown) and a driving transistor (not shown), which drive each of the light emitting elements LD.

The light emitting element layer LDL may include a plurality of the light emitting elements LD and a thin film encapsulation layer TFE. The thin film encapsulation layer TFE may cover the light emitting elements LD. The thin film encapsulation layer TFE may be disposed directly on the light emitting elements LD to encapsulate the light emitting elements LD.

Referring to FIG. 4, the light emitting element layer LDL may include the light emitting elements LD, as described above. Each of the light emitting elements LD may include a first electrode EL1, a second electrode EL2, and an emission part EM. The first electrode EL1 may be disposed on the circuit layer CL. The first electrode EL1 may be electrically connected to the driving transistor (not shown) to receive a driving signal. The first electrodes EL1 may be spaced apart from each other and may be exposed through openings defined through the pixel defining layer PDL, respectively. The second electrode EL2 may be disposed on the first electrode EL1. The emission part EM may be disposed between the first electrode EL1 and the second electrode EL2.

The first electrode EL1 and the second electrode EL2 of the light emitting element LD may have conductivity. The first electrode EL1 and the second electrode EL2 may include or be formed of a metal alloy or a conductive compound. The first electrode EL1 may be an anode. The first electrode EL1 may be a pixel electrode. The second electrode EL2 may be a cathode. The second electrode EL2 may be a common electrode. In an embodiment of the light emitting element LD, each of the first and second electrodes EL1 and EL2 may be a reflective electrode, a transparent electrode, or a semi-transparent electrode.

The emission part EM may include a hole transfer region HTR, an emission layer EML, and an electron transfer region ETR. Even though not shown in the drawings, the hole transfer region HTR may include a hole injection layer (not shown) and a hole transfer layer (not shown), and the electron transfer region ETR may include an electron injection layer (not shown) and an electron transfer layer (not shown).

The hole transfer region HTR may include an organic compound as a hole transfer material. The emission layer EML may include an organic compound or a quantum dot as a light emitting material. In such an embodiment, the light emitting element LD may be an organic electroluminescent element or a quantum-dot electroluminescent element. The emission layer EML may emit the third color light. The electron transfer region ETR may include an organic compound as an electron transfer material.

In an embodiment, where the emission layer EML includes the quantum dot, a core of the quantum dot may include at least one selected from a group II-VI compound, a group III-V compound, a group IV-VI compound, a group IV element, a group IV compound, and a combination thereof.

The group II-VI compound may be selected from a binary compound selected from CdSe, CdTe, ZnS, ZnSe, ZnTe, ZnO, HgS, HgSe, HgTe, MgSe, MgS, and a combination (e.g., a mixture) thereof a ternary compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The group III-V compound may be selected from a binary compound selected from GaN, GaP, GaAs, GaSb, AlN, AlP, AlAs, AlSb, InN, InP, InAs, InSb, and a combination thereof; a ternary compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a combination thereof and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The group IV-VI compound may be selected from a binary compound selected from SnS, SnSe, SnTe, PbS, PbSe, PbTe, and a combination thereof a ternary compound selected from SnSeS, SnSeTe, SnSTe, PbSeS, PbSeTe, PbSTe, SnPbS, SnPbSe, SnPbTe, and a combination thereof and a quaternary compound selected from SnPbSSe, SnPbSeTe, SnPbSTe, and a combination thereof. The group IV element may be selected from Si, Ge, and a mixture thereof. The group IV compound may be a binary compound selected from SiC, SiGe, and a mixture thereof.

In such an embodiment, the binary compound, the ternary compound, or the quaternary compound may exist in the quantum dot with a substantially uniform concentration. Alternatively, a concentration of the binary compound, the ternary compound or the quaternary compound in a portion of the quantum dot may be different from that of the binary compound, the ternary compound or the quaternary compound in another portion of the quantum dot. Alternatively, the quantum dot may have a core/shell structure in which one quantum dot surrounds another quantum dot. An interface of the core and the shell may have a concentration gradient in which a concentration of an element existing in the shell becomes progressively less toward a center.

In an embodiment, the quantum dot may have a core-shell structure which includes a core including the nano-crystal described above and a shell surrounding the core. The shell of the quantum dot may function as a protective layer for preventing chemical denaturation of the core to maintain semiconductor properties of the core and/or may function as a charging layer for allowing the quantum dot to have electrophoretic characteristics. The shell may be a single layer or a multi-layer. An interface of the core and the shell may have a concentration gradient in which a concentration of an element existing in the shell becomes progressively less toward a center. In one embodiment, for example, the shell of the quantum dot may be formed of a metal or non-metal oxide, a semiconductor compound, or a combination thereof.

In one embodiment, for example, the metal or non-metal oxide may include, but not limited to, a binary compound (e.g., $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO) or a ternary compound (e.g., $MgAl_2O_4$, $CoFe_2O_4$, $NiFe_2O_4$, or $CoMn_2O_4$).

The semiconductor compound may include, but not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and/or AlSb.

The quantum dot may have a full width of half maximum ("FWHM") of an emission wavelength spectrum that is about 45 nm or less (e.g., about 40 nm or less, or about 30 nm or less), and color purity and/or color reproduction may be improved in the range. In addition, light emitted through the quantum dot may be emitted in all directions, and thus a wide viewing angle may be improved or realized.

In such an embodiment, a shape of the quantum dot may be a general shape known in the art, and not be limited to a specific shape. In one embodiment, for example, the quantum dot may have a spherical shape, a pyramidal shape, a multi-arm shape, a cubic nanoparticle shape, a nanotube shape, a nanowire shape, a nanofiber shape, or a nano-plate particle shape.

A color of light emitted from the quantum dot may be controlled depending on a particle size of the quantum dot, and thus the quantum dot may have one of various emission colors such as a blue color, a red color, and a green color.

Each of the hole transfer region HTR, the emission layer EML and the electron transfer region ETR of the emission part EM may be a common layer continuously provided commonly in the light emitting elements LD. The first electrodes EL1 of the light emitting elements LD may be spaced apart from each other by a patterning process, but the hole transfer region HTR, the emission layer EML and the electron transfer region ETR may not be patterned but may extend over the entire portion of the light emitting element layer LDL.

However, embodiments of the invention are not limited thereto. In an alternative embodiment, the hole transfer region HTR, the emission layer EML or the electron transfer region ETR may be patterned into a plurality of portions corresponding to the light emitting elements LD, respectively.

The thin film encapsulation layer TFE may be disposed on the second electrode EL2. The thin film encapsulation layer TFE may be disposed directly on the second electrode EL2. In an alternative embodiment, the light emitting element LD further includes a capping layer (not shown), and the thin film encapsulation layer TFE may be disposed directly on the capping layer (not shown).

The second display substrate 200 may include an adhesive layer ADH, a partition portion BK, a first light blocking layer BM1, the light control layer WCL, a light selective filter LSF, and a window WD.

The adhesive layer ADH may be disposed on the first display substrate 100 to adhere the first display substrate 100 and the second display substrate 200 to each other. The adhesive layer ADH may be, for example, an optically clear adhesive. In an alternative embodiment, the adhesive layer ADH may be omitted.

The light control layer WCL may be disposed on the light emitting element layer LDL to control the wavelength of the third color light emitted from the light emitting element layer LDL. Hereinafter, for convenience of description, embodiments where the first color light is a red light, the second color light is a green light, and the third color light is a blue light will be described in detail. In such embodiments, the red light may be red light having a central wavelength in a range of about 600 nm to about 670 nm, the green light may be green light having a central wavelength in a range of about 500 nm to about 580 nm, and the blue light may be blue light having a central wavelength in a range of about 420 nm to about 480 nm.

The light control layer WCL may include the first light control part WCL1, the second light control part WCL2, and the third light control part WCL3.

The first light control part WCL1 may include a base resin BR, first quantum dots QD1, and scattering particles SC. The first quantum dots QD1 and the scattering particles SC may be dispersed in the base resin BR.

The first quantum dots QD1 may absorb the blue light and emit the red light. The first quantum dot QD1 may be substantially the same as the quantum dot included in the emission layer EML described above, and thus any repetitive detailed description thereof will be omitted.

The scattering particles SC may be $TiO_2$ or silica-based nanoparticles. However, embodiments of the invention are not limited thereto. The scattering particles SC may scatter light. Thus, a viewing angle of the display device DD may be increased or improved. Scattering particles SC included in the second and third light control parts WCL2 and WCL3, which will be described below, may be the same as the scattering particles SC included in the first light control part WCL1, and thus any repetitive detailed description thereof will be omitted.

The second light control part WCL2 may include a base resin BR, second quantum dots QD2, and scattering particles SC. The second quantum dots QD2 and the scattering particles SC may be dispersed in the base resin BR. The second quantum dots QD2 may absorb the blue light and emit the green light. The second quantum dot QD2 may be substantially the same as the quantum dot included in the emission layer EML described above, and thus any repetitive detailed description thereof will be omitted.

The third light control part WCL3 may include a base resin BR and scattering particles SC. Since the third light control part WCL3 does not include a quantum dot, the third light control part WCL3 may transmit the blue light emitted from the emission layer EML as it is. Since the third light control part WCL3 does not include a quantum dot, the amount of the scattering particles SC per unit area in the third light control part WCL3 may be greater than the amount of the scattering particles SC per unit area in each of the first and second light control parts WCL1 and WCL2.

The light selective filter LSF may be disposed on the light control layer WCL. The light selective filter LSF may include a liquid crystal filter LCF and a color filter CF.

The liquid crystal filter LCF may overlap the first light control part WCL1 and the second light control part WCL2 in the third direction DR3. The liquid crystal filter LCF may not overlap the third light control part WCL3 in the third direction DR3. The liquid crystal filter LCF may transmit the red light and the green light and may block the blue light. In such an embodiment, the liquid crystal filter LCF may have no polarization or low polarization with respect to the red light and the green light but may have polarization with respect to the blue light.

Herein, the term 'blocks' may not mean 100% of light is blocked. Even though the liquid crystal filter LCF has the polarization with respect to the blue light, the liquid crystal filter LCF may not have polarization of 100% with respect to an entire wavelength range of the blue light, and thus a portion of light of a blue wavelength range may transmit the liquid crystal filter LCF. Therefore, it may be understood that even though a portion of the blue light transmits the liquid crystal filter LCF, it may be described that the liquid crystal filter LCF blocks the blue light.

Herein, the term 'transmits' may not mean only that 100% of light is transmitted. Even though the liquid crystal filter LCF does not have the polarization with respect to the red light and green light, a portion of light of a red wavelength range and a portion of light of a green wavelength range may be absorbed in or reflected by the liquid crystal filter LCF, and thus transmittances of the red light and the green light may be reduced. Therefore, it may be understood that even though the transmittances of the red light and the green light are reduced, it may be described that the liquid crystal filter LCF transmits the red light and the green light.

Referring to FIG. 6, in an embodiment, the liquid crystal filter LCF may include a plurality of first liquid crystal groups LG1 and a plurality of second liquid crystal groups LG2.

Each of the first liquid crystal groups LG1 may include a plurality of first liquid crystal molecules LC1. The first liquid crystal molecules LC1 may be sequentially arranged in the first direction DR1 at a first distance L1.

Each of the second liquid crystal groups LG2 may include a plurality of second liquid crystal molecules LC2. The second liquid crystal molecules LC2 may be sequentially arranged in the first direction DR1 at a second distance L2.

The first liquid crystal molecules LC1 and the second liquid crystal molecules LC2 may be a lyotropic liquid crystal. The first liquid crystal molecules LC1 and the second liquid crystal molecules LC2 may include a dichlorobenzene derivative. The first liquid crystal molecules LC1 and the second liquid crystal molecules LC2 may be the lyotropic liquid crystal including the dichlorobenzene derivative.

The first distance L1 may be different from the second distance L2. In one embodiment, for example, the first distance L1 may be less than the second distance L2. A wavelength range of transmitted light and a wavelength range of blocked light may be determined or changed depending on a distance between liquid crystal molecules in the lyotropic liquid crystal, and thus wavelength ranges of lights transmitted and blocked by the first liquid crystal groups LG1 may be different from wavelength ranges of lights transmitted and blocked by the second liquid crystal groups LG2. When the first distance L1 is less than the second distance L2, the wavelength ranges of the lights transmitted and blocked by the first liquid crystal groups LG1 may be less than the wavelength ranges of the lights transmitted and blocked by the second liquid crystal groups LG2. In one embodiment, for example, the first liquid crystal groups LG1 may block light in a wavelength range less than about 500 nm and may transmit light in a wavelength range from about 500 nm to about 650 nm, and the second liquid crystal groups LG2 may block light in a wavelength range less than about 550 nm and may transmit light in a wavelength range from about 550 nm to about 650 nm.

A weight ratio of the first liquid crystal groups LG1 to the second liquid crystal groups LG2 in the liquid crystal filter LCF may be in a range from about 6:4 to about 8:2. In one embodiment, for example, the weight ratio of the first liquid crystal groups LG1 to the second liquid crystal groups LG2 may be in a range from about 6.5:3.5 to about 7.5:2.5. In such an embodiment, where the weight ratio of the first liquid crystal groups LG1 to the second liquid crystal groups LG2 is in the range described above, transmission ratios of the red light and the green light and a blocking ratio of the blue light may be maximized. However, embodiments of the invention are not limited thereto. The weight ratio may be adjusted depending on a kind of a material of the liquid crystal molecule.

Hereinafter, an embodiment of a liquid crystal molecule LC, e.g., the first liquid crystal molecule LC1 and the second liquid crystal molecule LC2, will be described with reference to FIG. 5. In an embodiment, the liquid crystal molecule LC may have a disk shape as illustrated in FIG. 5. However, the shape of the liquid crystal molecule LC is not limited thereto but may be variously modified.

The liquid crystal molecule LC may have a long axis LX and a short axis SX. In one embodiment, for example, where the liquid crystal molecule LC has an elliptical shape, the longest one of segments, each of which passes through a center of the liquid crystal molecule LC and has both end points meeting an ellipse, may be defined as the long axis LX, and a segment perpendicular to the long axis LX may be defined as the short axis SX. When the liquid crystal molecule LC has another shape, the longest one of segments, each of which passes through a center of mass of the liquid crystal molecule LC and has both end points meeting an edge of the liquid crystal molecule LC, may be defined as the long axis LX, and a segment perpendicular to the long axis LX may be defined as the short axis SX.

The liquid crystal filter LCF may be formed by coating the window WD with a hydrophilic solvent mixed with the liquid crystal molecules LC. The liquid crystal molecule LC may include a hydrophilic portion HPT and a hydrophobic portion HPB. When the liquid crystal molecules LC are mixed with the hydrophilic solvent (e.g., water), the hydrophobic portion HPB of the liquid crystal molecule LC may interact with the hydrophobic portion HPB of another liquid crystal molecule LC by, for example, attractive force of van der Waals force, and the hydrophilic portions HPT of the liquid crystal molecules LC may be exposed to the hydrophilic solvent. Thus, the liquid crystal molecules LC may be aligned. Alignment of the liquid crystal molecules LC may be adjusted by adjusting a coating direction of the liquid crystal molecules LC. After aligning the liquid crystal molecules LC, the liquid crystal filter LCF may be formed by evaporating the hydrophilic solvent.

Referring to FIGS. 4 and 6, the short axes of the first liquid crystal molecules LC1 and the short axes of the second liquid crystal molecules LC2 may be aligned in a same direction as each other. In one embodiment, for example, the short axes of the first liquid crystal molecules LC1 and the short axes of the second liquid crystal molecules LC2 may be aligned in the first direction DR1. Since the first liquid crystal molecules LC1 and the second liquid crystal molecules LC2 are aligned in a same direction as each other, the liquid crystal filter LCF may transmit the red light and the green light and may block the blue light.

Referring to FIG. 4, the color filter CF may overlap the third light control part WCL3 in the third direction DR3. The color filter CF may not overlap the first light control part WCL1 and the second light control part WCL2 in the third direction DR3. The color filter CF may absorb the red light and the green light and may transmit the blue light. The color filter CF may include at least one selected from a blue pigment and a blue dye. In one embodiment, for example, the color filter CF may include at least one selected from a xanthene dye, a cyanine dye, and an azapopyrine dye, as the blue dye. In one embodiment, for example, the color filter CF may include a copper phthalocyanine-based pigment as the blue pigment. The color filter CF may absorb red light and green light of light incident from the outside. Thus, visibility of the display device DD may be improved.

Conventionally, a polarizing layer including a circular polarizer (or a linear polarizer) and a λ/4 retarder may be provided in a display device to prevent reflection of external light. Alternatively, a red color filter may be disposed to overlap a red light emitting area, and a green color filter may be disposed to overlap a green light emitting area to prevent reflection of external light. If the polarizing layer is disposed in a display panel, a portion of light emitted from a light emitting element layer may be blocked by the polarizing layer while the light passes through the polarizing layer, and thus a light transmittance may be less than 50%. Therefore, light output efficiency may be reduced. If the red color filter and the green color filter are disposed in a display panel, a process time and a cost may be increased to pattern the color filters. In addition, the red color filter and the green color filter may not sufficiently block blue light incident from the outside.

According to embodiments of the invention, the display panel DP may include the light selective filter LSF which includes the liquid crystal filter LCF that transmits the red light and the green light and blocks the blue light, and the color filter CF that absorbs the red light and the green light and transmits the blue light. Thus, in such embodiments, the red light and the green light emitted from the first and second light control parts WCL1 and WCL2 may pass through the liquid crystal filter LCF, and the blue light (light incident from the outside and/or light emitted from the third light control part WCL3) may be selectively blocked by the liquid crystal filter LCF, such that light output efficiency of the display device DD may be improved.

In such embodiments, the display panel DP may be formed using a single coating process of the liquid crystal filter LCF and a single deposition process of the color filter CF, and thus a process time and a cost of the display panel DP may be reduced as compared with a conventional display device in which a display panel is typically formed using three deposition processes for the red color filter, the green color filter and the blue color filter.

In such embodiments, a transmittance of the blue light through the liquid crystal filter LCF may be lower than transmittances of the blue light through the red and green color filters, and thus the liquid crystal filter LCF may effectively block the blue light incident from the outside. As a result, it is possible to prevent deterioration of visibility which may be caused by light emitted from the first and second quantum dots QD1 and QD2, excited by external blue light, of the first and second light control parts WCL1 and WCL2.

In an embodiment, the first light blocking layer BM1 may be disposed under the light selective filter LSF. The first light blocking layer BM1 may be disposed between the first and second light control parts WCL1 and WCL2 and between the second and third light control parts WCL2 and WCL3. The first light blocking layer BM1 may overlap with the non-light emitting area NPXA when viewed in a plan view. Herein, it may be understood that when one or more components are viewed in a plan view, it or they may be viewed in a direction opposite to the third direction DR3 (e.g., the thickness direction). The first light blocking layer BM1 may include carbon black particles. In such an embodiment where the first light blocking layer BM1 is disposed in the display panel DP, it is possible to prevent lights emitted from adjacent light emitting areas from being mixed with each other. In an alternative embodiment, the first light blocking layer BM1 may be omitted.

The partition portion BK may be disposed under the first light blocking layer BM1. The partition portion BK may be disposed to correspond to (e.g., overlap) the pixel defining layer PDL. The partition portions BK may arranged in a one-to-one correspondence with the pixel defining layers PDL. The partition portion BK may be disposed between the first to third light control parts WCL1, WCL2 and WCL3 to prevent lights emitted from the first to third light control parts WCL1, WCL2 and WCL3 from being mixed with each other. A width of the partition portion BK may be less than a width of the first light blocking layer BM1.

The window WD may be disposed on the light selective filter LSF. The window WD may function as a support substrate for supporting the light selective filter LSF and the light control layer WCL. The window WD may be a glass substrate or a plastic substrate. The window WD may have a top surface and a bottom surface which are opposite to each other in the thickness direction. In an alternative embodiment, the window WD may be omitted.

Figure 7:
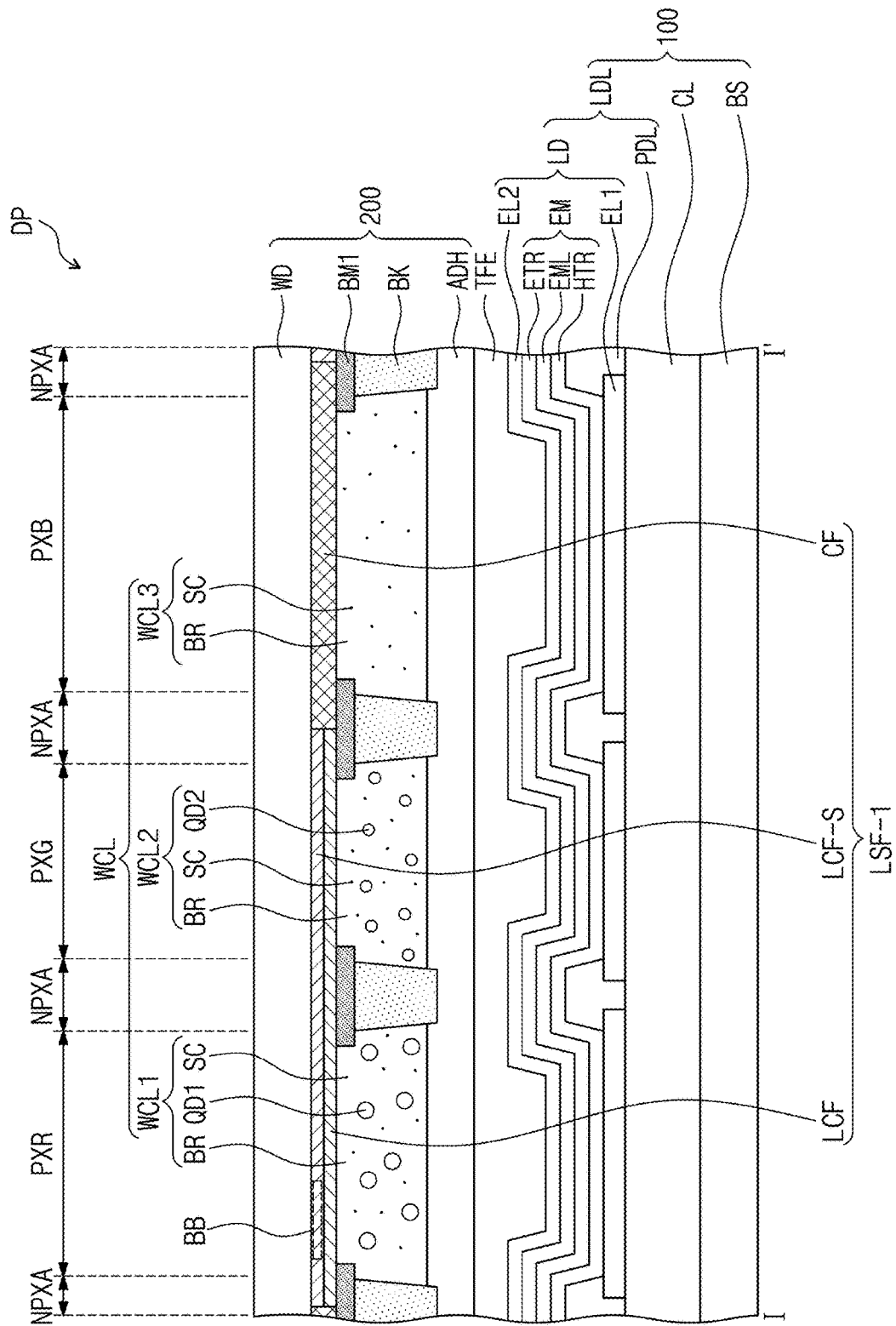
FIG. 7 is a cross-sectional view illustrating a display panel according to an alternative embodiment of the invention.
Figure 8:
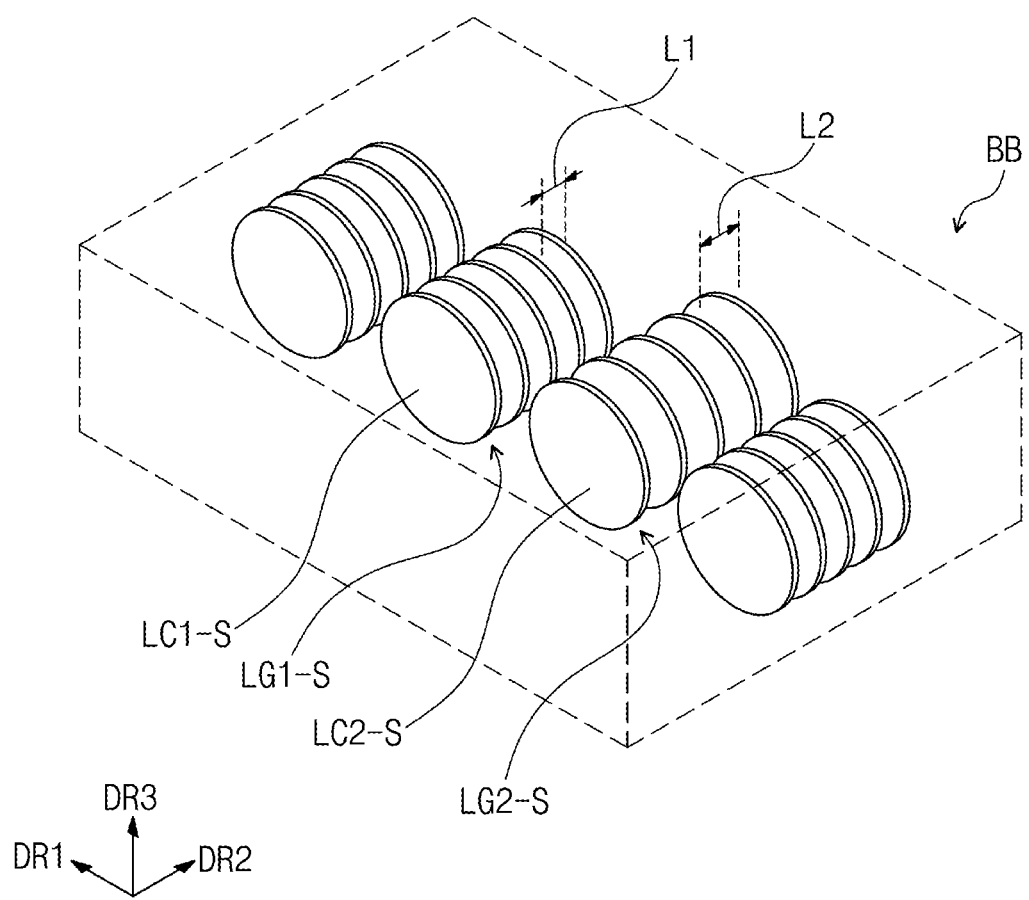
FIG. 8 is an enlarged perspective view corresponding to an area 'BB' of FIG. 7.

FIG. 7 is a cross-sectional view illustrating a display panel DP according to an alternative embodiment of the invention. FIG. 8 is an enlarged perspective view corresponding to an area 'BB' of FIG. 7.

Referring to FIGS. 7 and 8, an embodiment of a light selective filter LSF-1 may further include an auxiliary liquid crystal filter LCF-S. The auxiliary liquid crystal filter LCF-S may be disposed on the liquid crystal filter LCF. The auxiliary liquid crystal filter LCF-S may include first auxiliary liquid crystal groups LG1-S and second auxiliary liquid crystal groups LG2-S.

The first auxiliary liquid crystal groups LG1-S may include first auxiliary liquid crystal molecules LC1-S, and each of the first auxiliary liquid crystal molecules LC1-S includes a long axis and a short axis. The short axes of the first auxiliary liquid crystal molecules LC1-S included in the first auxiliary liquid crystal groups LG1-S may be aligned in a direction perpendicular to the short axes of the first liquid crystal molecules LC1 included in the first liquid crystal groups LG1. The first auxiliary liquid crystal molecules LC1-S may be aligned in a direction perpendicular to the first liquid crystal molecules LC1 when viewed in a plan view. The second auxiliary liquid crystal groups LG2-S may include second auxiliary liquid crystal molecules LC2-S, and each of the second auxiliary liquid crystal molecules LC2-S includes a long axis and a short axis. The short axes of the second auxiliary liquid crystal molecules LC2-S included in the second auxiliary liquid crystal groups LG2-S may be aligned in a direction perpendicular to the short axes of the second liquid crystal molecules LC2 included in the second liquid crystal groups LG2. The second auxiliary liquid crystal molecules LC2-S may be aligned in a direction perpendicular to the second liquid crystal molecules LC2 when viewed in a plan view.

The alignment directions of the first and second auxiliary liquid crystal molecules LC1-S and LC2-S may be different from the alignment directions of the first and second liquid crystal molecules LC1 and LC2, but the first and second auxiliary liquid crystal molecules LC1-S and LC2-S may be the same liquid crystal molecules as the first and second liquid crystal molecules LC1 and LC2. In such an embodiment, the first and second auxiliary liquid crystal groups LG1-S and LG2-S may be substantially the same as the first and second liquid crystal groups LG1 and LG2 except that the first and second auxiliary liquid crystal groups LG1-S and LG2-S are aligned in the direction perpendicular to the first and second liquid crystal groups LG1 and LG2.

In such an embodiment, the liquid crystal filter LCF and the auxiliary liquid crystal filter LCF-S disposed on the liquid crystal filter LCF may be aligned in the directions perpendicular to each other, and thus the blue light incident from the outside may be further effectively blocked. As a result, it is possible to effectively prevent the first and second light control parts WCL1 and WCL2 from being excited by external light, and thus color reproducibility of the display device DD may be improved.

Figure 9:
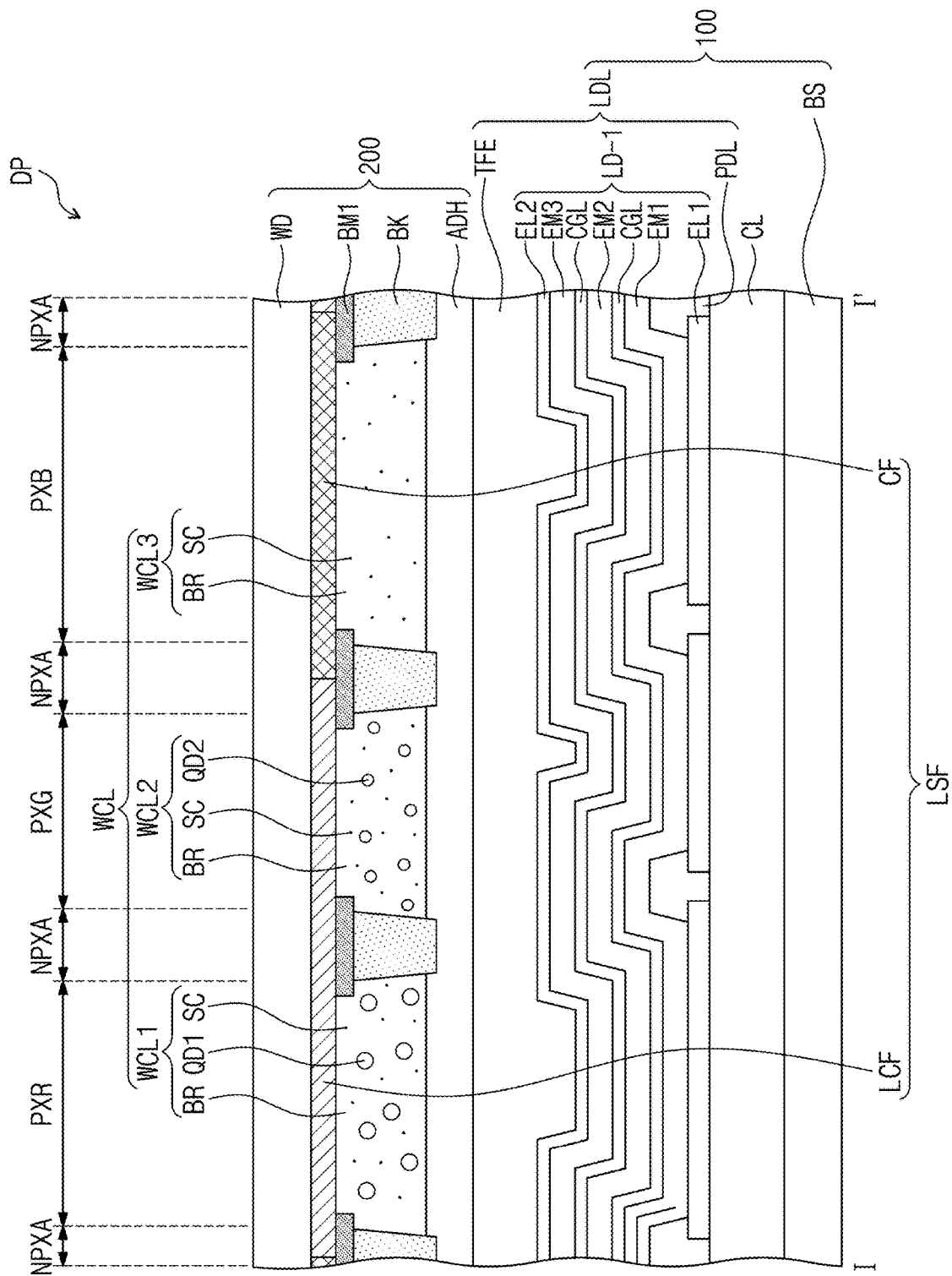
FIGS. 9 and 10 are cross-sectional views illustrating display panels according to alternative embodiments of the invention.
Figure 10:
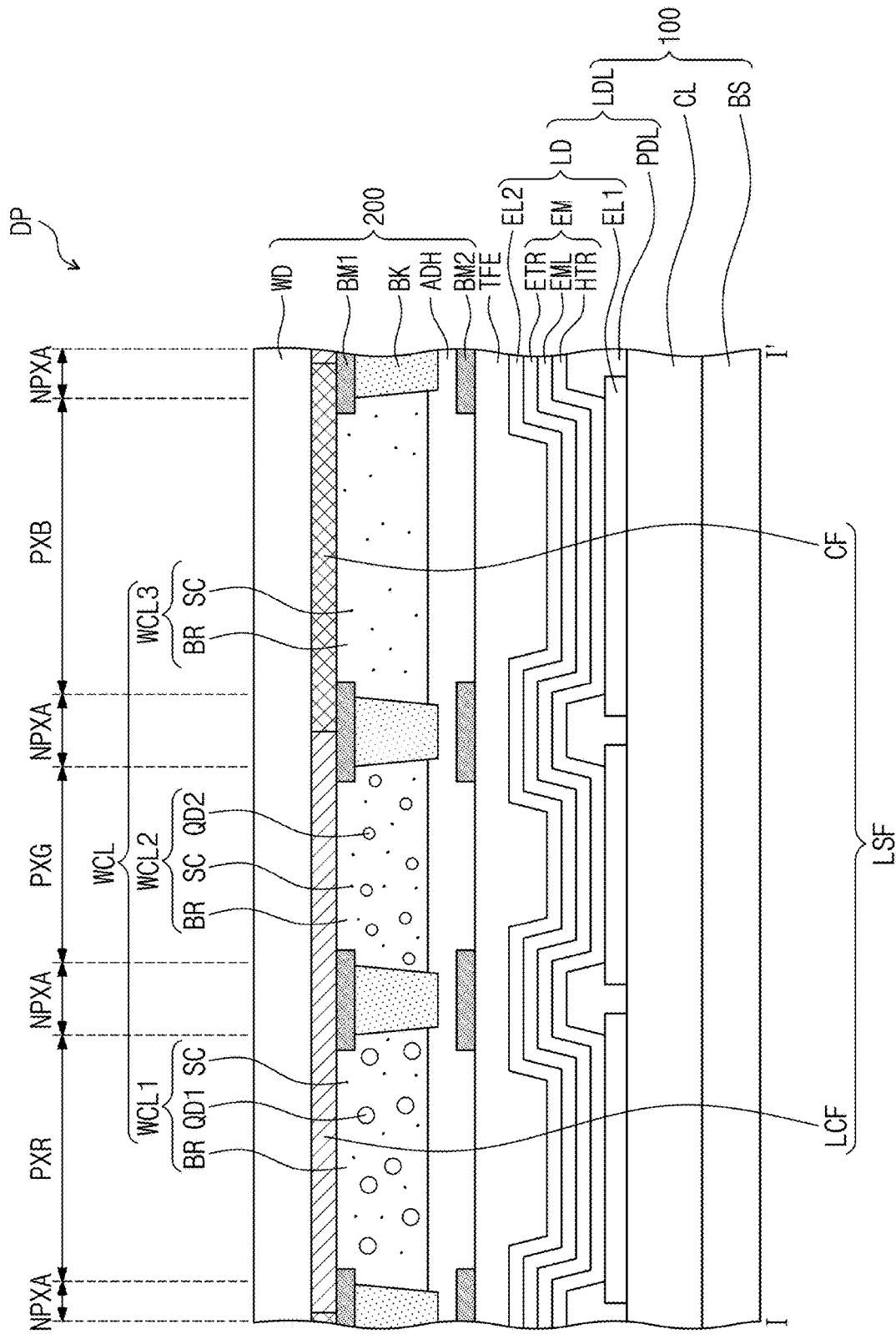

FIGS. 9 and 10 are cross-sectional views illustrating display panels according to alternative embodiments of the invention.

Referring to FIG. 9, each of light emitting elements LD-1 may include a plurality of emission parts EM1, EM2 and EM3. The emission parts EM1, EM2 and EM3 may be sequentially stacked. Each of the emission parts EM1, EM2 and EM3 may be substantially the same as the emission part EM described above with reference to FIG. 4, and thus any repetitive detailed descriptions thereof will be omitted. Since the light emitting element LD-1 includes the emission parts EM1, EM2 and EM3, a display device with high brightness and long life span may be provided.

In an embodiment, as shown in FIG. 9, the display panel DP of the embodiment includes three stacked emission parts EM1, EM2 and EM3. However, embodiments of the invention are not limited thereto. In alternative embodiment, two emission parts may be stacked, or four or more emission parts may be stacked. In one embodiment, for example, three or four emission parts may be stacked. In an embodiment where five or more emission parts are stacked, a driving voltage of the light emitting elements LD-1 may be increased.

A charge generating layer CGL may be disposed between the emission parts EM1, EM2 and EM3. When a voltage is applied to the charge generating layer CGL, charges may be generated from the charge generating layer CGL. The charge generating layer CGL may be disposed between adjacent emission parts EM1, EM2 and EM3 to adjust charge balance between the emission parts EM1, EM2 and EM3. In one embodiment, for example, the charge generating layer CGL may assist electron injection into a first emission part EM1 and may assist hole injection into a second emission part EM2.

The charge generating layer CGL may be a single layer in which an electron injection material and a hole injection material are mixed with each other. Alternatively, the charge generating layer CGL may include two or more layers. In one embodiment, for example, the charge generating layer CGL may include an N-type charge generating layer doped with N-type dopants and a P-type charge generating layer doped with P-type dopants. The N-type charge generating layer may be disposed directly on or adjacent to the electron transfer region ETR to assist electron injection, and the P-type charge generating layer may be disposed directly under or adjacent to the hole transfer region HTR to assist hole injection.

A material of the charge generating layer CGL is not limited to a specific material, but may be at least one of known materials. In an alternative embodiment, the charge generating layer CGL may be omitted.

Referring to FIG. 10, in another alternative embodiment, the display panel DP may further include a second light blocking layer BM2. The second light blocking layer BM2 may be disposed on the thin film encapsulation layer TFE and may overlap the first light blocking layer BM1 when viewed in a plan view. Since the display panel DP further includes the second light blocking layer BM2, light emitted from the light emitting element layer LDL may be effectively prevented from being incident to other light control parts except a corresponding light control part.

Figure 11:
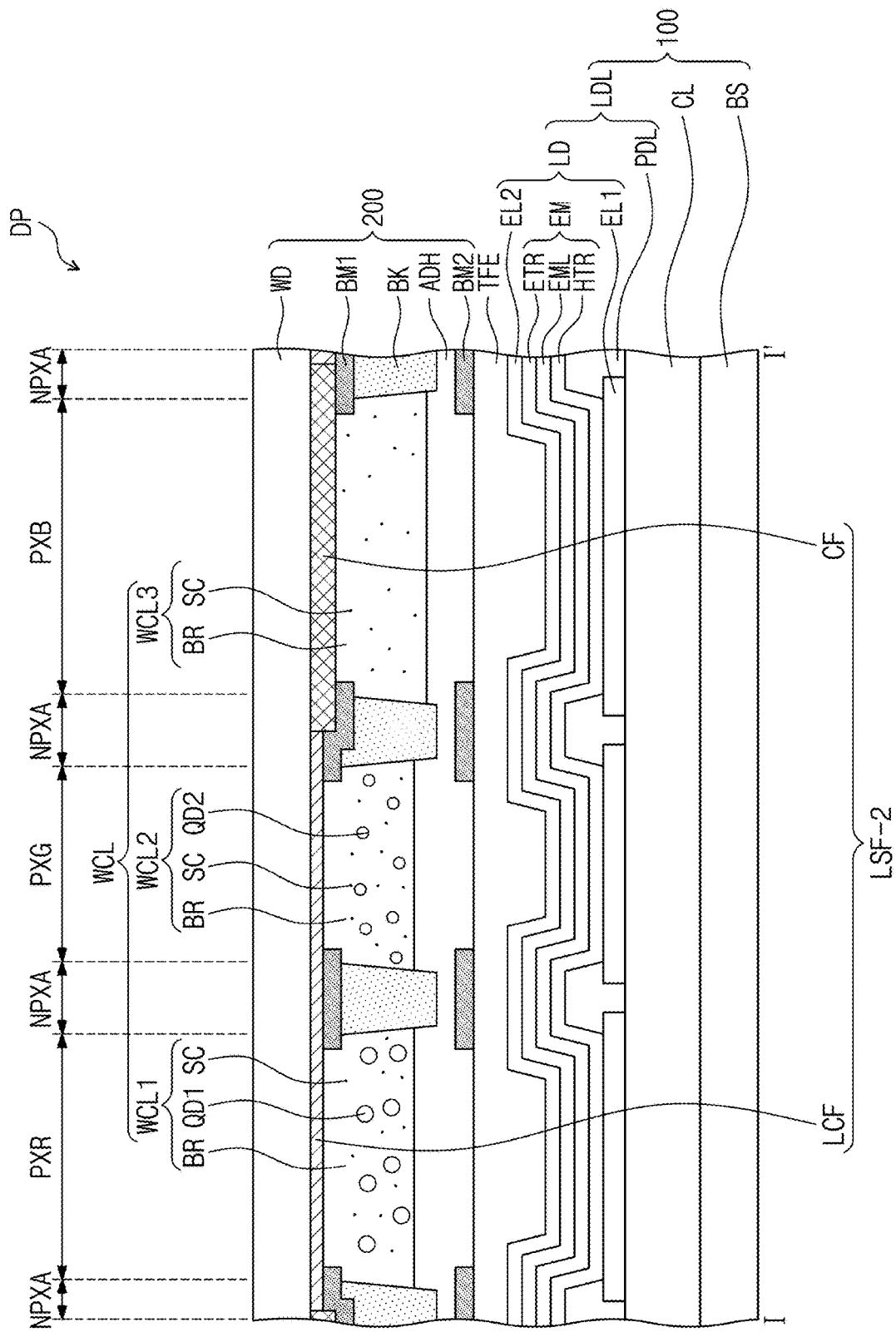
FIG. 11 is a cross-sectional view illustrating a display panel according to another alternative embodiment of the invention.

FIG. 11 is a cross-sectional view illustrating a display panel according to another alternative embodiment of the invention.

Referring to FIG. 11, a thickness of a liquid crystal filter LCF may be different from a thickness of a color filter CF in a light selective filter LSF-2. In such an embodiment, the liquid crystal filter LCF and the color filter CF may be coated and deposited in different steps, respectively, such that the thicknesses of the liquid crystal filter LCF and the color filter CF may be provided differently. The thickness of the liquid crystal filter LCF may be less than the thickness of the color filter CF.

In one embodiment, for example, the thickness of the liquid crystal filter LCF may be in a range from about 0.8 micrometer (μm) to about 20 μm. If the thickness of the liquid crystal filter LCF is less than about 0.8 μm, the liquid crystal filter LCF may not sufficiently block the blue light. If the thickness of the liquid crystal filter LCF is greater than about 20 μm, transmittances of the red light and the green light may be reduced, and thus light output efficiency may be reduced.

Figure 12:
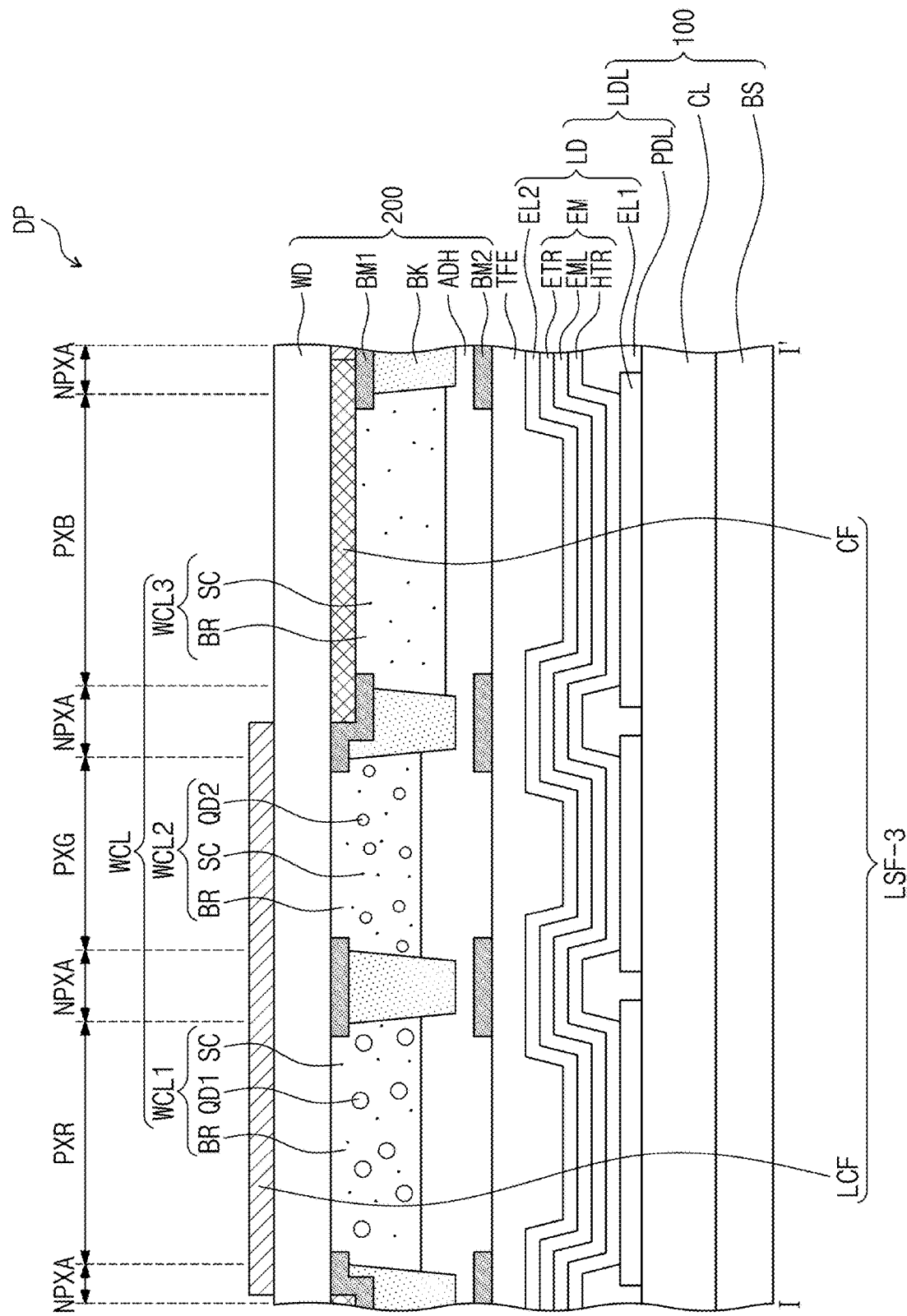
FIG. 12 is a cross-sectional view illustrating a display panel according to another alternative embodiment of the invention.

FIG. 12 is a cross-sectional view illustrating a display panel according to another alternative embodiment of the invention.

Referring to FIG. 12, in another alternative embodiment, a liquid crystal filter LCF of a light selective filter LSF-3 may be disposed on the top surface of the window WD, and a color filter CF of the light selective filter LSF-3 may be disposed on the bottom surface of the window WD. The liquid crystal filter LCF may be disposed directly on the top surface of the window WD. In such an embodiment, where the liquid crystal filter LCF is disposed on the top surface of the window WD, reflection of external light may be reduced or minimized even though an additional anti-reflection member is not disposed on the top surface of the window WD.

Hereinafter, alternative embodiments of the display device DD according to the invention will be described in greater detail with reference to FIGS. 13A and 13B. However, scopes of the invention are not limited to the following embodiments.

Figure 13A:
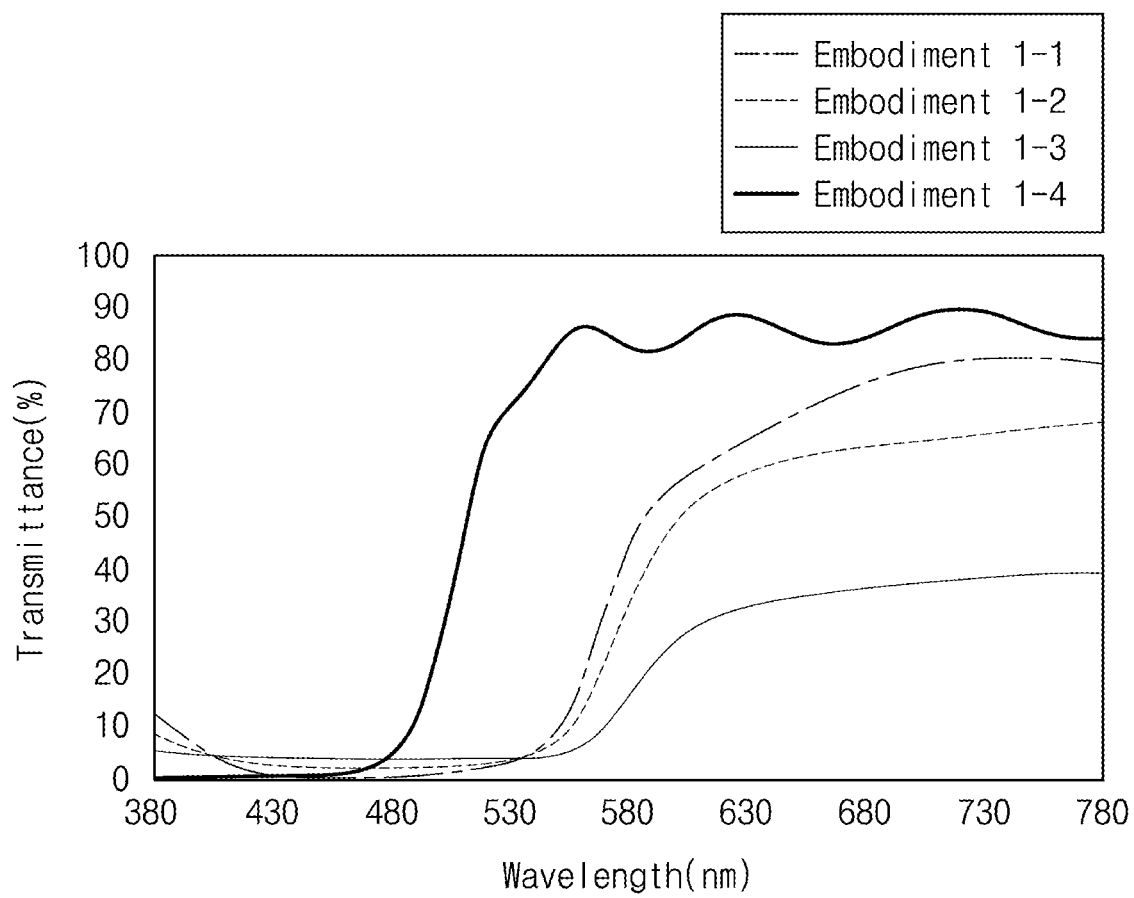
FIGS. 13A and 13B are graphs showing experimental results of embodiments of the invention.
Figure 13B:
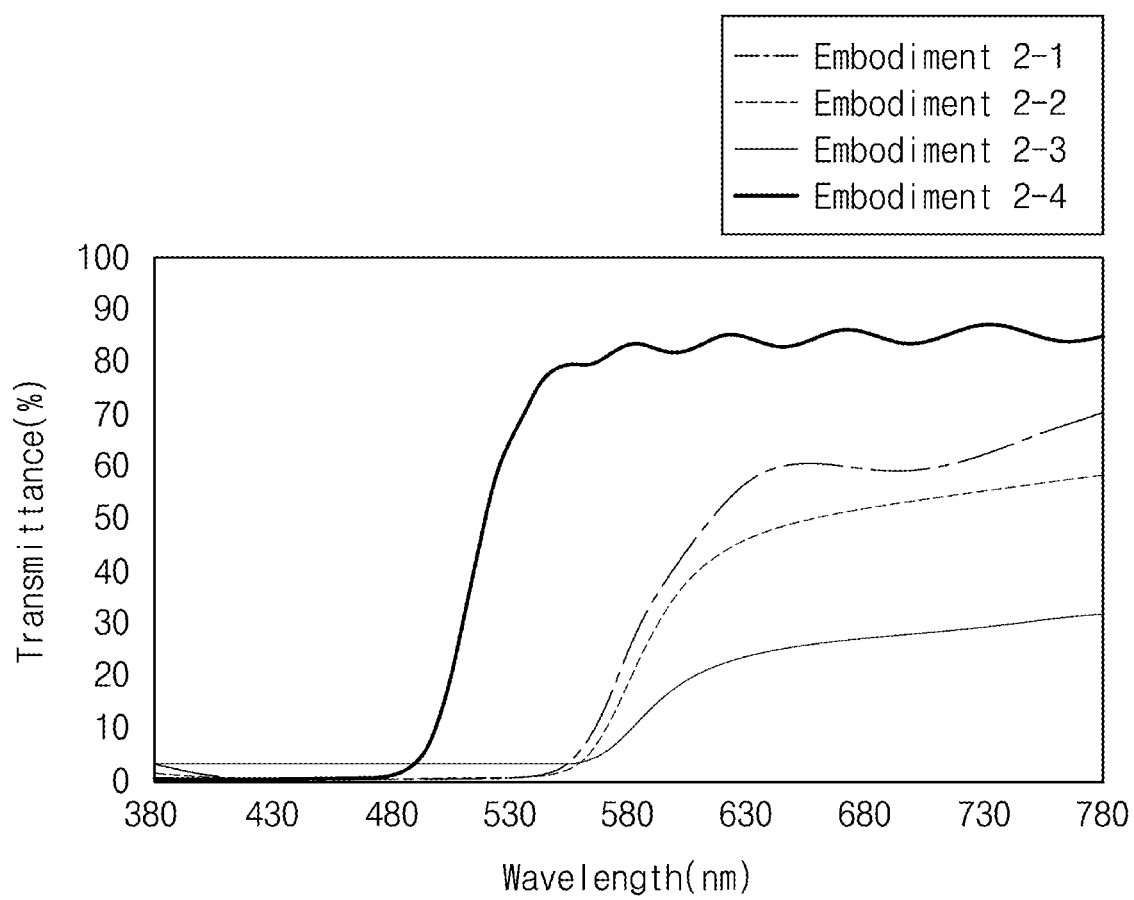

FIGS. 13A and 13B are graphs showing experimental results of embodiments of the invention.

Manufacturing of Liquid Crystal Filter

In each of embodiments 1-1 to 1-4 and embodiments 2-1 to 2-4, first liquid crystal molecules and second liquid crystal molecules were mixed with each other to manufacture a liquid crystal filter, and then, first auxiliary liquid crystal molecules and second auxiliary liquid crystal molecules were mixed with each other to manufacture an auxiliary liquid crystal filter. Short axes of the first auxiliary liquid crystal molecules and the second auxiliary liquid crystal molecules included in the auxiliary liquid crystal filter were aligned in a direction perpendicular to a direction of short axes of the first liquid crystal molecules and the second liquid crystal molecules included in the liquid crystal filter. In each of the embodiments 1-1 to 1-4, a total sum of thicknesses of the liquid crystal filter and the auxiliary liquid crystal filter was about 2 μm. In each of the embodiments 2-1 to 2-4, a total sum of thicknesses of the liquid crystal filter and the auxiliary liquid crystal filter was about 3 μm. Gray polarizer yellow ("GPY") of the Light polymer company was used as the first liquid crystal molecule, and gray polarizer red ("GPR") of the Light polymer company was used as the second liquid crystal molecule. Weight ratios of the first liquid crystal molecules to the second liquid crystal molecules were shown in the following table 1.

TABLE 1

| Manufacture embodiment | First liquid crystal molecule (wt %) | Second liquid crystal molecule (wt %) |
|---|---|---|
| Embodiment 1-1 | 12 | 88 |
| Embodiment 1-2 | 16 | 84 |
| Embodiment 1-3 | 20 | 80 |
| Embodiment 1-4 | 31.5 | 68.5 |
| Embodiment 2-1 | 12 | 88 |
| Embodiment 2-2 | 16 | 84 |
| Embodiment 2-3 | 20 | 80 |
| Embodiment 2-4 | 31.5 | 68.5 |

Referring to FIGS. 13A and 13B, the liquid crystal filters of the embodiments 1-1 to 1-4 and the embodiments 2-1 to 2-4 transmit red light and green light and block blue light. In particular, since each of the embodiments 1-1 to 1-4 and the embodiments 2-1 to 2-4 includes both the liquid crystal filter and the auxiliary liquid crystal filter, a transmittance of the blue light is close to 0%.

Referring to the embodiments 1-1 to 1-4 and the embodiments 2-1 to 2-4, a change in light transmittance according to a total thickness of the liquid crystal filter and the auxiliary liquid crystal filter is not large.

Referring to the embodiment 1-4 and the embodiment 2-4, when the weight ratio of the first liquid crystal molecules to the second liquid crystal molecules is about 3:7, the blue light having a wavelength less than about 500 nm is effectively blocked, and the green light and the red light which have wavelengths of about 500 nm or greater are effectively transmitted. Thus, in such embodiments of the liquid crystal filter where the weight ratio of the first liquid crystal molecules to the second liquid crystal molecules is about 3:7, the liquid crystal filter may effectively transmit the red light and the green light emitted from the first and second light control parts WCL1 and WCL2, and thus the light output efficiency may be increased or improved. In such an embodiment, since the liquid crystal filter effectively blocks the blue light incident from the outside, it is possible to prevent the first and second quantum dots QD1 and QD2 of the first and second light control parts WCL1 and WCL2 from being excited by external light to emit light.

In embodiments of the invention, the display device may include the light selective filter including the liquid crystal filter and the color filter. The liquid crystal filter may overlap the red light emitting area and the green light emitting area. The liquid crystal filter may transmit the red light and the green light and may block the blue light. Thus, the light output efficiency of the display device may be improved. In such embodiments, the light selective filter may be formed through a single liquid crystal filter coating process and a single color filter deposition process, and thus the process time and the process cost may be reduced.

According to embodiments of the invention, the light output efficiency of the display device may be improved.

According to embodiments of the invention, the reflection of external light may be reduced, and thus the visibility of the display device may be improved.

While the invention have been described with reference to exemplary embodiments, it will be apparent to those skilled in the art that various changes and modifications may be made without departing from the spirits and scopes of the invention. Therefore, it should be understood that the embodiments are not limiting, but illustrative. Thus, the scopes of the invention are to be determined by the broadest permissible interpretation of the following claims and their equivalents, and shall not be restricted or limited by the foregoing description.

What is claimed is:

1. A display device comprising:
a plurality of light emitting elements which emits a blue light;
a light control layer disposed on the light emitting elements and including: a first light control part which absorb the blue light and emits a red light; a second light control part which absorbs the blue light and emits a green light; and a third light control part which transmits the blue light; and
a light selective filter disposed on the light control layer, wherein the light selective filter comprises:
a liquid crystal filter overlapping the first light control part and the second light control part, wherein the liquid crystal filter transmits the red light and the green light and blocks the blue light; and
a color filter overlapping the third light control part, wherein the color filter absorbs the red light and the green light and transmits the blue light,
wherein the liquid crystal filter comprises:
a plurality of first liquid crystal groups, wherein each of the first liquid crystal groups includes a plurality of first liquid crystal molecules sequentially arranged in a first direction at a first distance; and
a plurality of second liquid crystal groups, each of the second liquid crystal groups includes a plurality of second liquid crystal molecules sequentially arranged in the first direction at a second distance different from the first distance,
wherein each of the first liquid crystal molecules and the second liquid crystal molecules has a long axis and a short axis,
wherein the light selective filter further comprises:
an auxiliary liquid crystal filter disposed on the liquid crystal filter, wherein the auxiliary liquid crystal filter includes a plurality of first auxiliary liquid crystal groups and a plurality of second auxiliary liquid crystal groups,
wherein the first auxiliary liquid crystal groups include a plurality of first auxiliary liquid crystal molecules,
wherein each of the first auxiliary liquid crystal molecules has a short axis and a long axis, and the short axis of each of the first auxiliary liquid crystal molecules is aligned in a direction perpendicular to an aligned direction of the short axis of each of the first liquid crystal molecules when viewed in a plan view,
wherein the second auxiliary liquid crystal groups include a plurality of second auxiliary liquid crystal molecules,
wherein each of the second auxiliary liquid crystal molecules has a short axis and a long axis, and the short axis of each of the second auxiliary liquid crystal molecules is aligned in a direction perpendicular to an aligned direction of the short axis of each of the second liquid crystal molecules when viewed in the plan view.

2. The display device of claim 1, wherein
the red light has a central wavelength in a range of about 600 nm to about 670 nm,
the green light has a central wavelength in a range of about 500 nm to about 580 nm, and
the blue light has a central wavelength in a range of about 420 nm to about 480 nm.

3. The display device of claim 1, wherein the first distance is less than the second distance.

4. The display device of claim 1, wherein the first liquid crystal molecules and the second liquid crystal molecules are a lyotropic liquid crystal.

5. The display device of claim 1, wherein the first liquid crystal molecules and the second liquid crystal molecules include a dichlorobenzene derivative.

6. The display device of claim 1, wherein
the first liquid crystal groups block light in a wavelength range less than about 500 nm and transmit light in a wavelength range from 500 nm to 650 nm, and
the second liquid crystal groups block light in a wavelength range less than about 550 nm and transmit light in a wavelength range from about 550 nm to about 650 nm.

7. The display device of claim 1, wherein a weight ratio of the first liquid crystal groups to the second liquid crystal groups in the liquid crystal filter is in a range from about 6:4 to about 8:2.

8. The display device of claim 1, wherein
each of the first liquid crystal molecules and the second liquid crystal molecules has a long axis and a short axis, and
the short axis of each of the first liquid crystal molecules and the short axis of each of the second liquid crystal molecules are aligned in a same direction as each other.

9. The display device of claim 1, wherein
the first light control part includes a plurality of first quantum dots which absorbs the blue light and emits the red light, and
the second light control part includes a plurality of second quantum dots which absorbs the blue light and emits the green light.

10. The display device of claim 1, wherein the color filter includes at least one selected from a blue pigment and a blue dye.

11. The display device of claim 1, further comprising:
a light blocking layer disposed between the first and second light control parts and between the second and third light control parts.

12. The display device of claim 1, wherein each of the light emitting elements includes at least one selected from an organic electroluminescent element and a quantum-dot electroluminescent element.

* * * * *